United States Patent
Lee (10) Patent No.: US 7,020,340 B2
(45) Date of Patent: Mar. 28, 2006

(54) METHODS FOR COMPRESSING AND DECOMPRESSING DATA

(75) Inventor: Hoi-Jin Lee, Sungnam (KR)

(73) Assignee: Samsung Electronics, Co., Ltd., (KR)

( * ) Notice: Subject to any disclaimer, the term of this patent is extended or adjusted under 35 U.S.C. 154(b) by 675 days.

(21) Appl. No.: 10/270,869

(22) Filed: Oct. 15, 2002

(65) Prior Publication Data

US 2003/0085823 A1   May 8, 2003

(30) Foreign Application Priority Data

Oct. 19, 2001   (KR) ........................... 2001-0064644

(51) Int. Cl.
  *G06K 9/36*   (2006.01)

(52) U.S. Cl. ...................... 382/236; 382/232; 382/233; 382/245; 382/238

(58) Field of Classification Search ................ 382/232, 382/236, 233, 238, 245; 375/240.16, 240.03, 375/240.25

See application file for complete search history.

(56) References Cited

U.S. PATENT DOCUMENTS

| 6,104,434 A * | 8/2000 | Nakagawa et al. | .... 375/240.16 |
| 6,333,949 B1 * | 12/2001 | Nakagawa et al. | .... 375/240.16 |
| 6,798,836 B1 * | 9/2004 | De With et al. | ........ 375/240.16 |

OTHER PUBLICATIONS

Mogul et al., "Potential Benefits of Delta Ecoding and Data Compression for HTTP", ACM, Oct. 1997, pps. 181-194.*

* cited by examiner

*Primary Examiner*—Anh Hong Do
(74) *Attorney, Agent, or Firm*—Mills & Onello, LLP (57) ABSTRACT

In methods for compressing data, when differences between two adjacent data among a series of N data, where N is a positive integer, are all less than a reference value, delta data values are generated on the basis of the differences. When the differences are the reference value or less and at least one delta data is stored, a command indicating that compression operations are performed on the basis of the differences, the number of the stored delta data, and the stored delta data are generated as compressed data. The compression method of the present method can obtain higher compression efficiency as compared with conventional RLC or modified-RLC compression methods.

12 Claims, 9 Drawing Sheets

METHODS FOR COMPRESSING AND DECOMPRESSING DATA

RELATED APPLICATION

This application relies for priority upon Korean Patent Application No. 2001-64644, filed on Oct. 19, 2001, the contents of which are herein incorporated by reference in their entirety.

FIELD OF THE INVENTION

The present invention relates to methods for compressing data and, more particularly, to methods for compressing data that can improve compression efficiency when differences between series of data are small.

BACKGROUND OF THE INVENTION

RLC (run length coding) is appreciated as the most suitable technique for compressing binary image data. In the RLC method, series of repeated data are replaced with repeated numbers and pairs of data. When the size of the repeated data is great or the data are frequently repeated, the compression efficiency becomes high. Especially in the case of image data, RLC techniques are quite efficient since the data used for representing the same color are equal. The most important advantage of the RLC techniques is their simplicity in realizing the compression of data. Such RLC compression techniques are used not only for compression of multimedia data such as image data or sound data, but also for data transmission between systems.

The RLC techniques will now be described by the following example.

data string 1:
0x00, 0x01, 0x02, 0x03, 0x04, . . . , 0xfc, 0xfd, 0xfe, 0xff data string 2:
0x20, 0x22, 0x28, 0x25, 0x21, . . . , 0x23, 0x21, 0x25, 0x27 data string 3:
0x0a, 0x0a, 0x0a, 0x0a, 0x0a, . . . , 0x0a, 0x0a, 0x0a, 0x0a data string 4:
0x05, 0x11, 0x3f, 0x2e, 0x91, . . . , 0x0a, 0xab, 0x7f, 0x19

Data string 1 comprises 256 units of 8-bit data. Data string 2 comprises 256 units of 8-bit data. Data string 3 comprises 256 units of 8-bit data "0a". Data string 4 comprises 256 units of 8-bit data that are irregularly arranged.

Under the RLC techniques, the data strings 1 through 4 are compressed as follows.

data string 1-1:
(0x00:0x00), (0x00:0x01), (0x00:0x02), (0x00:0x03), (0x00:0x04), . . . , (0x00:0xfc), (0x00:0xfd), (0x00:0xfe), (0x00:0xff)

data string 2-1:
(0x00:0x20), (0x00:0x22), (0x00:0x28), (0x00:0x25), (0x00:0x21), . . . , (0x00:0x23), (0x00:0x21), (0x00:0x25), (0x00:0x27)

data string 3-1:
(0xff:0x0a)

data string 4-1:
(0x00:0x05), (0x00:0x11), (0x00:0x3f), (0x00:0x2e), (0x00:0x91), . . . , (0x00:0x0a), (0x00:0xab), (0x00:0x7f), (0x00:0x19)

The notation form of the RLC approach is (number of repeated data 5 elements:data value). For example, in data string 1, since the hexadecimal data "00" is repeated once, they are converted into (0x00:0x00). In data string 3, the hexadecimal data "0a" is repeated 256 times, thus being converted into (0xff:0x0a).

According to the foregoing RLC technique, the 256-byte data comprised in the data string 1 are converted into the data of 256*(1+1) or 512 bytes, and the 256-byte data comprised in the data string 2 are converted into the data of 256*(1+1) or 512 bytes. The 256-byte data comprised in the data string 3 are converted into the data of 1*(1+1) or 2 bytes, and the 256-byte data comprised in the data string 4 are converted into the data of 256*(1+1) or 512 bytes.

In other words, the 768-byte data comprised in the data strings 1 through 4 are converted into the data of 512+512+2+512=1538 bytes by the RLC technique. The 1538 bytes of "compressed" data are 1.5 times as much as the original size (256+256+256+256=1024 bytes) of the data strings 1 through 4. As a result, when a series of adjacent data are frequently changed, the RLC compression technique may cause the data size to actually be increased.

To solve the foregoing problem of the conventional RLC techniques, a modified-RLC technique has been proposed. In the modified-RLC technique, the original data are converted into a form (command: data [, data, data, . . . , data]). The "command" is the number of a series of equal data or the number of a series of unequal data. Table 1 shows commands and respective meanings thereof.

TABLE 1

| Command | Meaning |
| --- | --- |
| 01 | EQ #2 |
| 02 | EQ #3 |
| 03 | EQ #4 |
| 04 | EQ #5 |
| . | |
| . | |
| . | |
| 7e | EQ #127 |
| 7f | EQ #128 |
| 80 | NEQ #128 |
| 81 | NEQ #127 |
| . | |
| . | |
| . | |
| Fd | NEQ #4 |
| Fe | NEQ #3 |
| Ff | NEQ #2 |
| 00 | NEQ #1 |

As shown in Table 1, the modified-RLC technique makes it possible to represent not only a series of equal data of 128 or less, but also a series of unequal data of 128 or less. By using the modified-RLC technique, the data strings 1 through 4 are compressed as follows.

data string 1-2
(0x80:0x01, 0x02, 0x03, . . . , 0x7d, 0x7e, 0x7f)
(0x80:0x80, 0x81, 0x82, . . . , 0xfd, 0xfe, 0xff)

data string 2-2
(0x80:0x20, 0x22, 0x28, . . . , 0x23, 0x21, 0x22)
(0x80:0x25, 0x21, 0x27, . . . , 0x21, 0x25, 0x27)

data string 3-2
(0x7f:0x0a)
(0x7f:0x0a)

data string 4-2
(0x80:0x05, 0x11, 0x3f, . . . , 0x5c, 0x00, 0x39)
(0x80:0x11, 0x81, 0x3f, . . . , 0xab, 0x7f, 0x19)

In the data string 1, since the 256 data bytes are different from each other, the data string 1-2 is divided into two groups, each of which consists of 128 data bytes according to the modified-RLC. Likewise, in the data string 2, since the 256 data bytes are different from each other, the data string 2-2 is divided into two groups, each of which consists of 128 data bytes.

When the data string 1 of 256 bytes is compressed by the modified-RLC, the data string 1-2 becomes (1+128)*2=258 bytes; when the data string 2 of 256 bytes is compressed by the modified-RLC, the data string 2-2 becomes (1+128)*2=258 bytes; when the data string 3 of 256 bytes is compressed by the modified-RLC, the data string 3-2 becomes (1+1)*2=4 bytes; and when the data string 4 of 256 bytes is compressed by the modified-RLC, the data string 4-2 becomes (1+128)*2=258 bytes. That is, the total 1024-byte data are compressed to 258+258+4+258=778 bytes, or $\frac{3}{4}^{th}$ of the original data size. However, in the event that a series of data are frequently changed like the data strings 1, 2, and 4, the compression efficiency still remains low.

Generally, series of multimedia-type data, particularly series of image data, tend to change progressively. For instance, in the case where a human face is photographed by a camera and converted into image data, most of the image data correspond to skin color. However, since the skin color changes slightly with varied direction of light, a value of the image data also changes. As mentioned above, when the adjacent data have slightly different values for indicating light and darkness, both the RLC and the modified-RLC have a significantly low compression rate. In addition, the size of the compressed data becomes greater.

SUMMARY OF THE INVENTION

It is therefore a feature of the present invention to provide a method for compressing data, which can improve compression efficiency when differences between adjacent data elements are small.

It is another feature of the present invention to provide a method for decompressing the data compressed by the method for compressing data, which can improve the compression efficiency when the differences between the adjacent data elements are small.

The feature of the present invention may be achieved by the following method for compressing data using a data compressor. The data compressor receives a series of N data elements, where N is a positive integer, and computes respective differences between two adjacent data among the data. When the differences are all less than a reference value, the data compressor generates delta data on the basis of the differences, receives a series of N new data elements the series of the prior data, and returns to the step of computing the differences. When the differences are the reference value or less and at least one delta data is generated, the data compressor outputs a command indicating that the delta data are compressed on the basis of the differences, the number of the delta data, and the delta data values.

In the embodiment, the method for generating the delta data comprises converting the differences between the two adjacent data into the corresponding delta values, and concatenating the delta values in series to generate the delta values.

The other feature of the present invention may be achieved by the following method for compressing data using the data compressor. The data compressor replaces the present data with prior data. The data compressor receives new present data following the prior data. The data compressor computes the difference between the prior data and the present data, and stores the difference. The data compressor increases a value of a first counter when the difference between the prior data and the present data lies between 0 and the reference value; returns to the replacing step when the value of the first counter is less than K (K is a positive integer); and generates the delta data on the basis of the differences when the value of the first counter is K. When the difference between the prior data and the present data is 0 or more than the reference value, and at least one delta data value is generated, the data compressor outputs the command, the number of the delta data values, and the delta data value.

The other feature of the present invention also may be achieved by the following method for decompressing the data using a data decompressor. Initially, the data decompressor receives the command. When the command indicates that data compression was based on the differences, the data decompressor receives the number of the compressed data, a first data, and a second data. Thereafter, the data decompressor decompresses original data to the number of N from the first and second data, and increases the value of the counter. The foregoing operations are performed repeatedly until the number of the compressed data equals the value of the counter.

In the data compression method of the present invention, when differences between the two adjacent data among a series of N data are all less than a reference value, delta data are generated on the basis of the differences. The compression method of the present invention can obtain higher compression efficiency as compared with conventional RLC or modified-RLC compression methods.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be more fully described hereinafter with reference to the accompanying drawings, in which preferred embodiments of the invention are shown.

Figure 1:
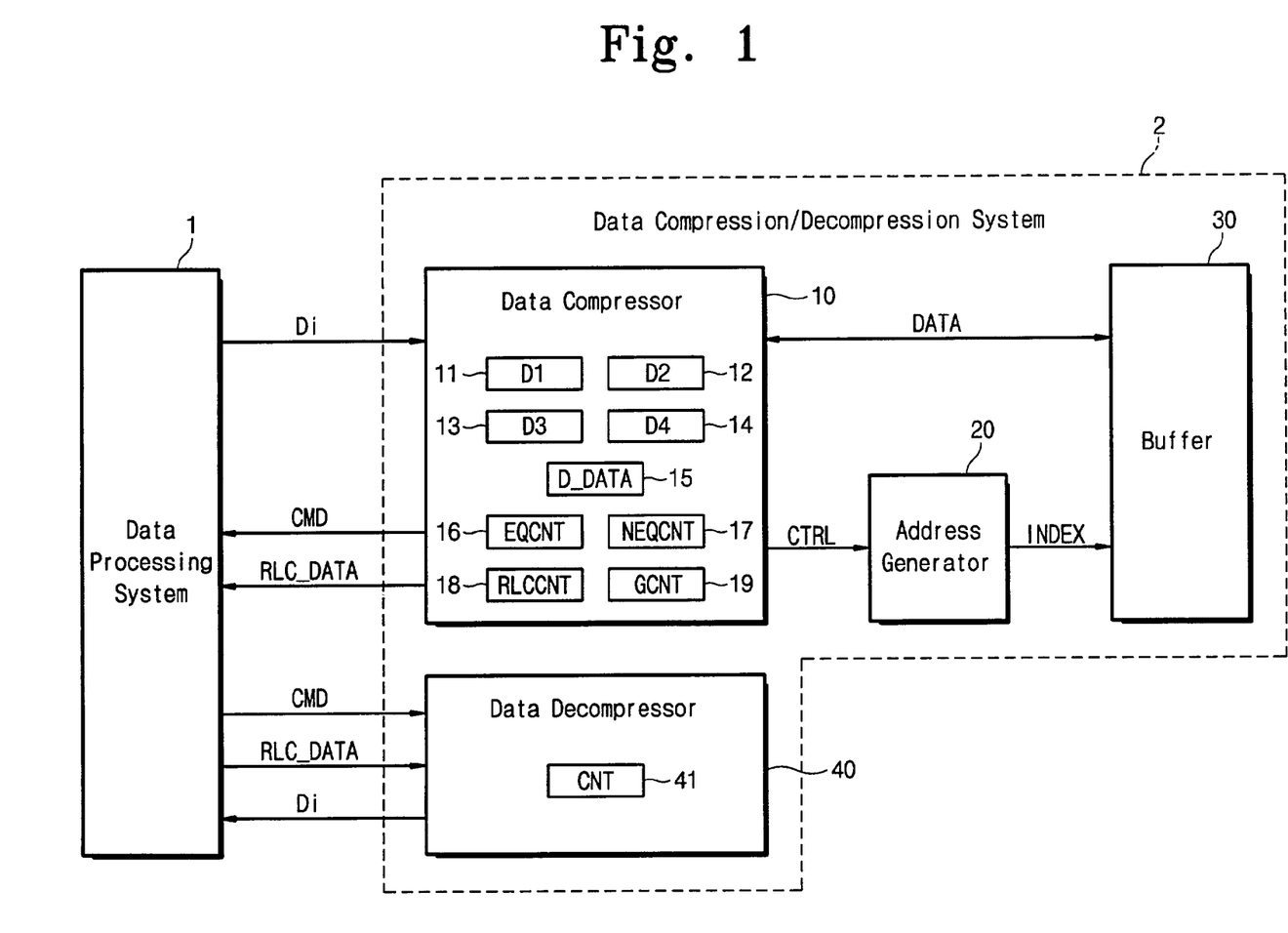
FIG. 1 is a block diagram of a data compression/decompression system in accordance to a preferred embodiment of the present invention.

FIG. 1 is a block diagram of a data compression/decompression system in accordance with a preferred embodiment of the present invention. Referring to FIG. 1, the data compression/decompression system 2 comprises a data compressor 10, an address generator 20, a buffer 30, and a data decompressor 40. The data compressor 10 receives data Di from a data processing system 1 and performs a delta- RLC compression process or a general modified-RLC compression process. Intermediate data, which are generated while the data compressor 10 performs the compression operation, are stored in the buffer 30. When the compression operation is completed, a command CMD and compressed data RLC_DATA are transferred to the data processing system 1. The data compressor 10 comprises registers 11–15 and counters 16–19 that are necessary for the compression operation that will be described below. The address generator 20 generates an index address INDEX in response to a control signal CTRL provided from the data compressor 10. The index address INDEX indicates a position of the buffer 30 where the data generated from the data compressor 10 will be stored. Hereinafter, the compression/decompression operation of the data compression/decompression system 2 as shown in FIG. 1 will be described in detail.

According to the preferred embodiment of the present invention, the data compression/decompression system 2 compresses a series of four data D1, D2, D3, and D4 elements as the following Equation 1 by using the delta-RLC compression technique.

$$(D1, D2, D3, D4) = (\text{First Data:Concatenation} \quad \{\text{Delta}(D1, D2), \text{Delta}(D2, D3), \text{Delta}(D3, D4)\}) \quad [\text{Equation 1}]$$
$$= (\text{First Data:Delta Data})$$

Table 2 shows delta values corresponding to both respective absolute values of differences between the second data D2 and the first data D1, and respective differences between the second data D2 and the first data D1.

TABLE 2

| $|D2 - D1|$ | $D2 - D1$ | Delta (D1, D2) |
|---|---|---|
| \|1\| | +2 | 00 |
| \|2\| | +1 | 01 |
| \|3\| | −1 | 00 |
| \|4\| | −2 | 11 |

In addition, the following Table 3 shows delta values corresponding to both respective absolute values of differences between the third data D3 and the second data D2 (or respective absolute values of differences between the fourth data D4 and the third data D3), and respective differences between the third data D3 and the second data D2 (or respective differences between the fourth data D4 and the third data D3).

TABLE 3

| $|D3 - D2|$ ($|D4 - D3|$) | $D3 - D2$ ($D4 - D3$) | DELTA (D2, D3) (DELTA (D3, D4)) |
|---|---|---|
| \|1\| | +4 | 000 |
| \|2\| | +3 | 001 |
| \|3\| | +2 | 010 |
| \|4\| | +1 | 011 |
| \|5\| | −1 | 100 |
| \|6\| | −2 | 101 |
| \|7\| | −3 | 110 |
| \|8\| | −4 | 111 |

In the present embodiment, a delta value is computed by using an absolute value of a difference between two adjacent data elements instead of using a difference between two adjacent data elements.

Hereinafter, to explain the data compression/decompression system 2 in accordance to the preferred embodiment of the present invention, the compression processes of the data strings 1 through 4 will be described in terms of examples.

Differences between two adjacent data are all "1" among a series of four data 0x00, 0x01, 0x02, and 0x03 of the data string 1. In this case, the delta value Delta(D1, D2) of the first and second data 0x00 and 0x01 is "00"; the delta value Delta(D2, D3) of the second and third data 0x01 and 0x02 is "000"; and the delta value Delta(D3, D4) of the third and fourth data 0x02 and 0x03 is "000". When the delta values "00", "000", and "000" of the two adjacent data among the first to fourth data are connected in series, they becomes a binary number "0000 0000", which is "0x00" in number of 16 bits.

The above description can be summarized as the following Equation 2.

$$(0 \times 00, 0 \times 01, 0 \times 02, 0 \times 03) = (0 \times 00\text{:Concatenation} \quad 0b00, 0b000, 0b000) \quad [\text{Equation 2}]$$
$$= (0 \times 00\text{:}0 \times 00)$$

In the result of the Equation 2 "(0x00:0x00)", the former "0x00" represents the first data element D1 that are compressed by the delta-RLC, while the latter "0x00" is the delta data obtained by connecting in series the delta values "00", "000", and "000".

As another example, when a series of four data elements 0x20, 0x22, 0x28, and 0x25 of the data string 2 are compressed by the delta-RLC technique, the result can be represented according to Equation 3.

$$(0 \times 20, 0 \times 22, 0 \times 28, 0 \times 25) = (0 \times 00\text{:Concatenation} \quad \{b01, 0b101, 0b010\}) \quad [\text{Equation 3}]$$
$$= (0 \times 00\text{:}0 \times 6A)$$

When a series of the four data elements D1, D2, D3, and D4 are compressed, the absolute values of the differences between the second and first data D2 and D1 should be 4 or less because the delta value corresponding to the difference between the second and first data D2 and D1 should be able to be indicated in 2 bits of the binary number. Meanwhile, both the delta value corresponding to the difference between the third and second data D3 and D2 and the delta value corresponding to the difference between the fourth and third data D4 and D3 should be able to be indicated in 3 bits of the binary number. Accordingly, both the absolute values of the differences between the third and second data D3 and D2 and the absolute values of the difference between the fourth and third data D4 and D3 should be 8 or less.

The operations of the data compression/decompression system 2 as shown in FIG. 1 will now be described in detail with reference to the accompanying drawings, FIGS. 2A through 2D.

FIGS. 2A through 2D are flow charts showing control steps that the delta-RLC method comprises in the data compression/decompression system 2 as shown in FIG. 1 in accordance to the preferred embodiment of the present invention.

Figure 2A:
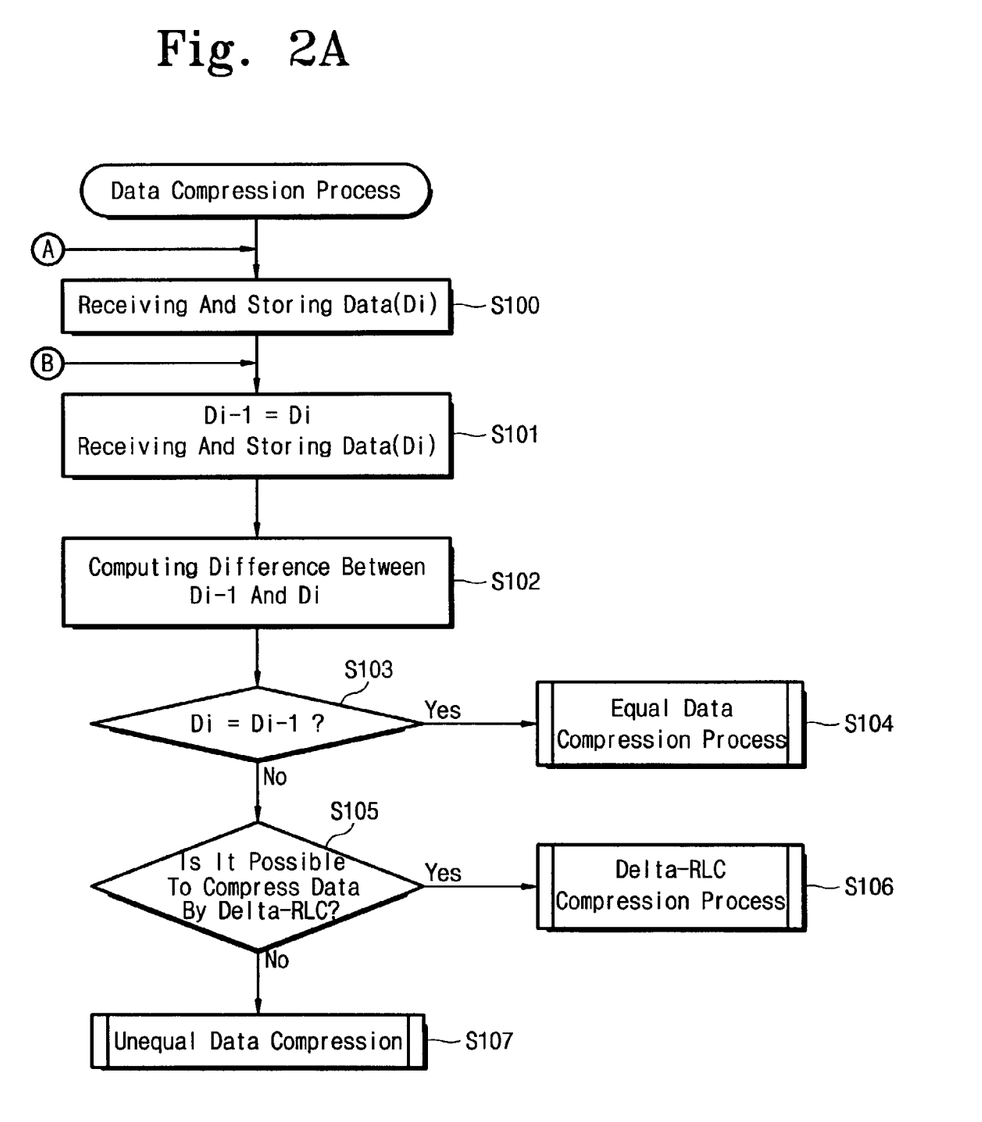
FIGS. 2A through 2D are flow charts illustrating control steps that a delta-RLC method comprises in the data compression/decompression system 2 as shown in FIG. 1 in accordance with the preferred embodiment of the present invention.

Referring now to FIG. 2A, in step S100, the data compressor 10 receives the data Di from the data processing system 1 and stores the data Di in the register 11. The data D1 stored in the register 11 is the first data that will be compressed in the delta-RLC operation that will be described below.

In the next step S101, the data compressor 10 regards the data Di stored in the register 11 as a prior data Di-1, receives the next data Di from the data processing system 1, and stores the next data Di in the register 12. The data Di stored in the register 12 becomes the present data. In step S102, the data compressor 10 computes a difference between the prior data Di-1 stored in the register 11 and the present data Di stored in the register 12.

In step S103, the data compressor 10 determines whether the prior data Di-1 and the present data Di are equal. As a result, if the prior data Di-1 and the present data Di are equal, the control proceeds with step S104, thus performing an equal data compression process. If the prior data Di-1 and the present data Di are not equal, the control proceeds with step S105.

In step S105, the data compressor 10 determines whether the absolute value of the difference between the prior and present data Di-1 and Di equals a reference value REF1 or REF2 or less, thereby determining whether the data may be compressed by the delta-RLC compression process. If the difference between the prior and present data Di-1 and Di is a reference value REF1 or REF2 or less, the data compressor 10 determines that the prior and present data Di-1 and Di can be compressed by the delta-RLC of the present invention. Thus, the control proceeds with step S106. If the difference between the prior and present data Di-1 and Di is more than a reference value REF1 or REF2, the data compressor 10 determines that the prior and present data Di-1 and Di cannot be compressed by the delta-RLC of the present invention. Thus, the control proceeds with step S107. In step S107, the data compressor 10 performs an unequal data compression process.

When a series of four data D1, D2, D3, and D4 are compressed, the absolute values of the differences between the second and first data D2 and D1 should be 4 or less since the delta values corresponding to the differences between the second and first data D2 and D1 should be able to be indicated in 2 bits of the binary number. Therefore, the reference value should be 4(=REF1) in step 105. Meanwhile, both the delta values corresponding to the differences between the third and second data D3 and D2, and the delta values corresponding to the differences between the fourth and third data D4 and D3 should be able to be indicated in 3 bits of the binary number. For this reason, both the absolute values of the differences between the third and second data D3 and D2, and the absolute values of the differences between the fourth and third data D4 and D3 should be 8 or less. Accordingly, in this example, the reference value should be 8(=REF2) in step S105.

Hereinafter, the equal data compression process of step S104, the delta-RLC compression process of step S106, and the unequal data compression process of step S107 will be described in detail.

Referring again to FIG. 1, an EQCNT counter 16 performs a count-up operation when the present data Di and the prior data are equal; an NEQCNT counter 17 performs the count-up operation when the present data Di and the prior data are not equal; an RLCCNT counter 18 counts how many times the delta-RLC compression process S106 is performed, and is cleared when a count value becomes 4; and a GCNT counter 19 performs the count-up operation when the RLCCNT counter 18 becomes 4. Referring to the foregoing basic operations of the counters 16–19, the delta-RLC compression process, the equal data compression process, and the unequal data compression process will be separately described.

Figure 2B:
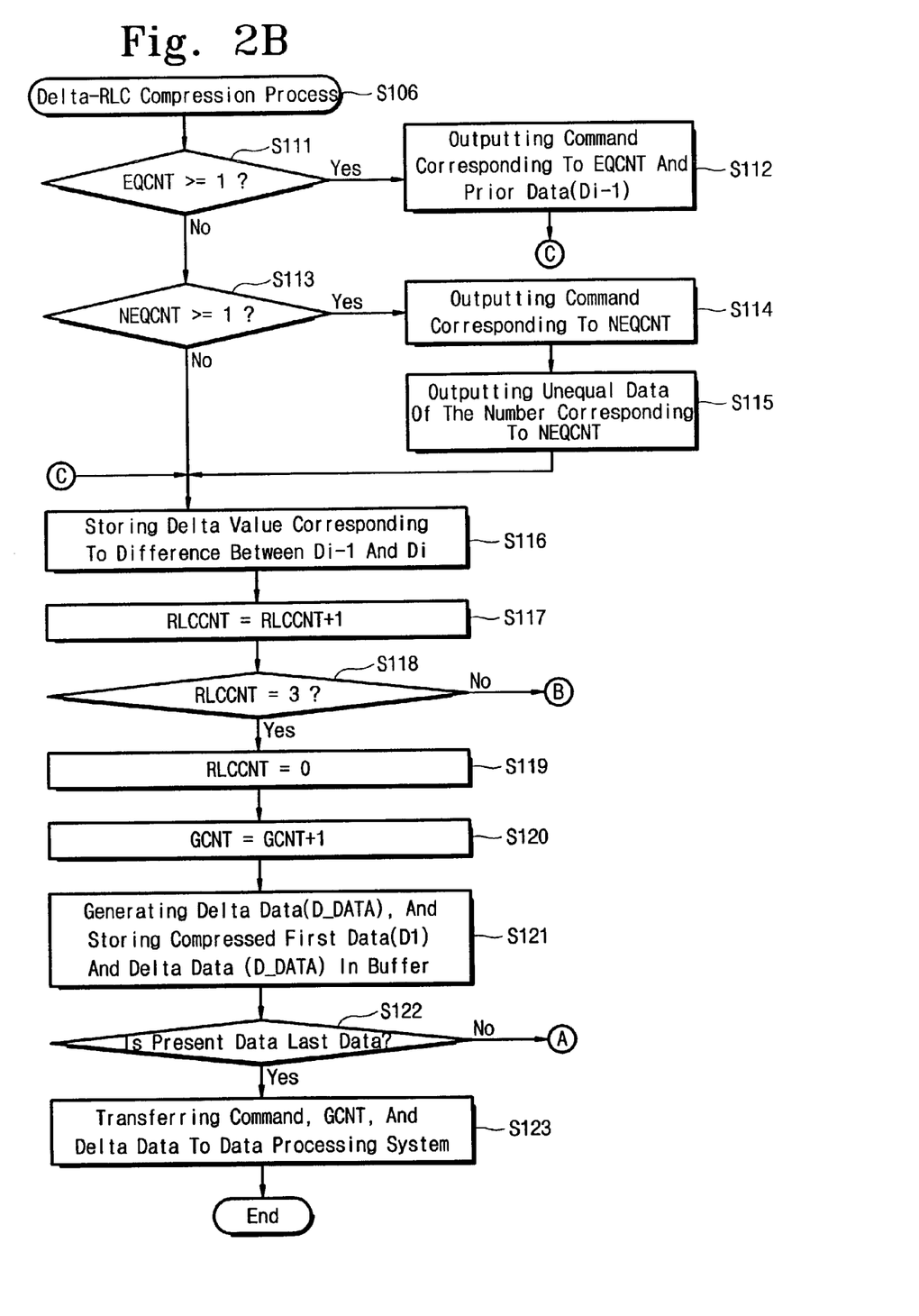

To begin with, FIG. 2B is a flow chart showing the delta-RLC compression process S106 of the data compression/depression system 2 as shown in FIG. 1. For the purpose of understanding the delta-RLC compression process S106, the data string 1 "0x00, 0x01, 0x02, 0x03, 0x04, . . . , 0xfc, 0xfd, 0xfe, 0xff" that are exemplified above is input into the data compression/decompression system 2. In steps S103 and S105, the prior data Di-1=D1=0x00 and the present data Di=D2=0x01 are not equal, and the absolute value of the difference between the present data Di=D2=0x01 and the prior data Di-1=D1=0x00 is less than the reference value REF=4=0b100. Therefore, the delta-RLC compression process S106 is performed.

Referring to FIG. 2B, in step S111, the data compressor 10 determines whether the value of the EQCNT counter 16 equals 1 or more. If the value of the EQCNT counter 16 equals "1" or more, the control proceeds with step S112. In step S112, the data compressor 10 outputs a command corresponding to the value of the EQCNT counter 16, outputting the prior data Di-1 as an equal data. If the value of the EQCNT counter 16 is less than "1", the control proceeds with step S113. The operation of step S112 will be described in detail below.

In step S113, the data compressor 10 determines whether the value of the NEQCNT counter 17 equals 1 or more. If the value of the NEQCNT counter 17 equals 1 or more, the control proceeds with step S114. In step S114, the data compressor 10 outputs the command corresponding to the value of the NEQCNT counter 17. In step S115, the data compressor 10 outputs unequal data of the number corresponding to the value of the NEQCNT counter 17. The operations of steps S114 and S115 will be described in detail below.

In step S116, the data compressor 10 stores the delta value 0b00 corresponding to the difference 0b01 between the prior data Di-1=D1=0x00 and the present data Di=D2=0x01 in the register 15. In step S117, the data compressor 10 increases the value of the RLCCNT counter 18 by 1.

In step S118, the data compressor 10 determines whether the value of the RLCCNT counter 18 is 3. As a result, if the value of the RLCCNT counter 18 is 3, the control proceeds with step S119. Otherwise, the control proceeds with step S101 as shown in FIG. 2A and receives new data Di. Since the value of the RLCCNT counter 18 is 1, the control proceeds with step S101.

Referring again to FIG. 2A, in step S101, the data compressor 10 regards the data D2 stored in the register 12 as the prior data Di-1, receives new data Di=D3 from the data processing system 1, and stores the new data Di=D3 in the register 13. Because the difference between the prior data Di-1=D2=0x01 stored in the register 12 and the present data Di=D3=0x03 stored in the register 13 is less than the reference value REF2=8=0b1000, the delta-RLC compression process S104 is performed again.

Referring to FIG. 2B, since both values of the EQCNT counter 16 and the NEQCNT counter 17 still remain "0", the control proceeds with step S116. In step S116, the delta value 0b000 corresponding to the difference 0b001 between the prior data D2=0×01 and the present data D3=0×02 is stored in the register 15. In step S118, the data compressor 10 increases the value of the RLCCNT counter 18 by 1. Accordingly, the value of the RLCCNT counter 18 becomes 2. Since the value of the RLCCNT counter 18 is not 3, the control proceeds with step S101.

Referring again to FIG. 2A, in step S101, the data compressor 10 regards the data D3 stored in the register 13 as the prior data Di-1, receives new data Di=D4 from the data processing system 1, and stores the new data Di=D4 in the register 14. Because the difference between the prior data Di-1=D3=0×02 stored in the register 13 and the present register Di=D4=0×03 stored in the register 14 is less than the reference value REF2=0b1000, the delta-RLC compression process S104 is performed.

Referring to FIG. 2B, since both values of the EQCNT counter 16 and the NEQCNT counter 17 still remain "0", the control proceeds with step S116. In step S116, the delta value 0b000 corresponding to the difference 0b001 between the prior data D3=0×02 and the present data D4=0×03 is stored in the register 15. In step S117, the data compressor 10 increases the value of the RLCCNT counter 18 by 1. The value of the RLCCNT counter becomes 3.

In step S118, since the data compressor 10 determines that the value of the RLCCNT counter 18 is 3, the control proceeds with step S119. In step S119, the data compressor 10 clears the value of the RLCCNT counter 18 to be 0. In step S120, the data compressor 10 increases the value of the GCNT counter 19 by 1.

In step S121, the data compressor 10 stores the first data D1=0×00 stored in the register 11 in the buffer 30. Also, the data compressor 10 concatenates the delta values 0b00, 0b000, and 0b000 stored in register 15 in series, generates delta data D_DATA=0b00000000=0×00, and stores the delta data D_DATA=0b00000000=0×00 in the buffer 30. The data compressor 10 outputs the control signal CTRL whenever the data compressor 10 outputs the data that will be stored in the buffer 30. The address generator 20 outputs the index address in response to the control signal CTRL provided from the data compressor 10. The index address INDEX points to a predetermined position of the buffer 30. For example, the index address INDEX sequentially increases. Accordingly, compression start data D1=0×00 and the delta data D_DATA=0×00 are stored in the buffer 30.

In step S122, the data compressor 10 determines whether the present data Di is the last data. As a result, if the present data Di is the last data, the control proceeds with step S123. If the present data Di is not the last data, the control returns to step S100 as shown in FIG. 2A.

In step S123, the data compressor 10 reads the command CMD=7f indicating the delta-RLC compression, the value of the GCNT counter 19, and the delta data D_DATA stored in the buffer 30, then transferring to the data processing system 1.

In the case where the data string 1 is compressed as described above, 64 pairs of the compression start data and the delta data are stored in the buffer 30. That is, the count value of the GCNT counter 19 is 64. After compressing the last data 0×ff, the data compressor 10 reads pairs of the compression start data and the delta data stored in the buffer 30, and transfers to the data processing system 1. At this time, the data compressor 10 transfers the command CMD=7f indicating the delta-RLC compression to the data processing system 1 first, then transferring the pairs of the compression start data and the delta data as the compressed data RLC_DATA to the data processing system 1. The result of the delta-RLC compression with respect to the data string 1 is represented according to Equation 4.

$$\left(CMD: \underset{\text{value of the counter}}{CGNT} : \underset{\text{data}}{\text{compression start}}, \right.$$
$$\left. \underset{\text{data}}{\text{delta}} \left[\underset{\text{data}}{\text{compression start}}, \underset{\text{data}}{\text{delta}} \cdots\right]\right) =$$
$$(0 \times 7f : 0 \times 40 : 0 \times 00, 0 \times 00, 0 \times 00,$$
$$0 \times 00, \ldots, 0 \times 00, 0 \times 00)$$

[Equation 4]

When the data compression/decompression system 2 compresses the data string 2 as described above, the result is as follows.

(0×7f:0×40:0×20, 0×6A, . . . , 0×23, 0×59)

The following Table 4 represents commands CMDs generated from the data compression/decompression system 2 in accordance to the preferred embodiment of the present invention and respective meanings thereof.

TABLE 4

| Command (CMD) | Meaning |
| --- | --- |
| 01 | EQ #2 |
| 02 | EQ #3 |
| 03 | EQ #4 |
| 04 | EQ #5 |
| . | |
| . | |
| 7e | EQ #127 |
| 7f | Delta-RLC compression |
| 80 | NEQ #128 |
| 81 | NEQ #127 |
| . | |
| . | |
| Fd | NEQ #4 |
| Fe | NEQ #3 |
| Ff | NEQ #2 |
| 00 | NEQ #1 |

Figure 2C:
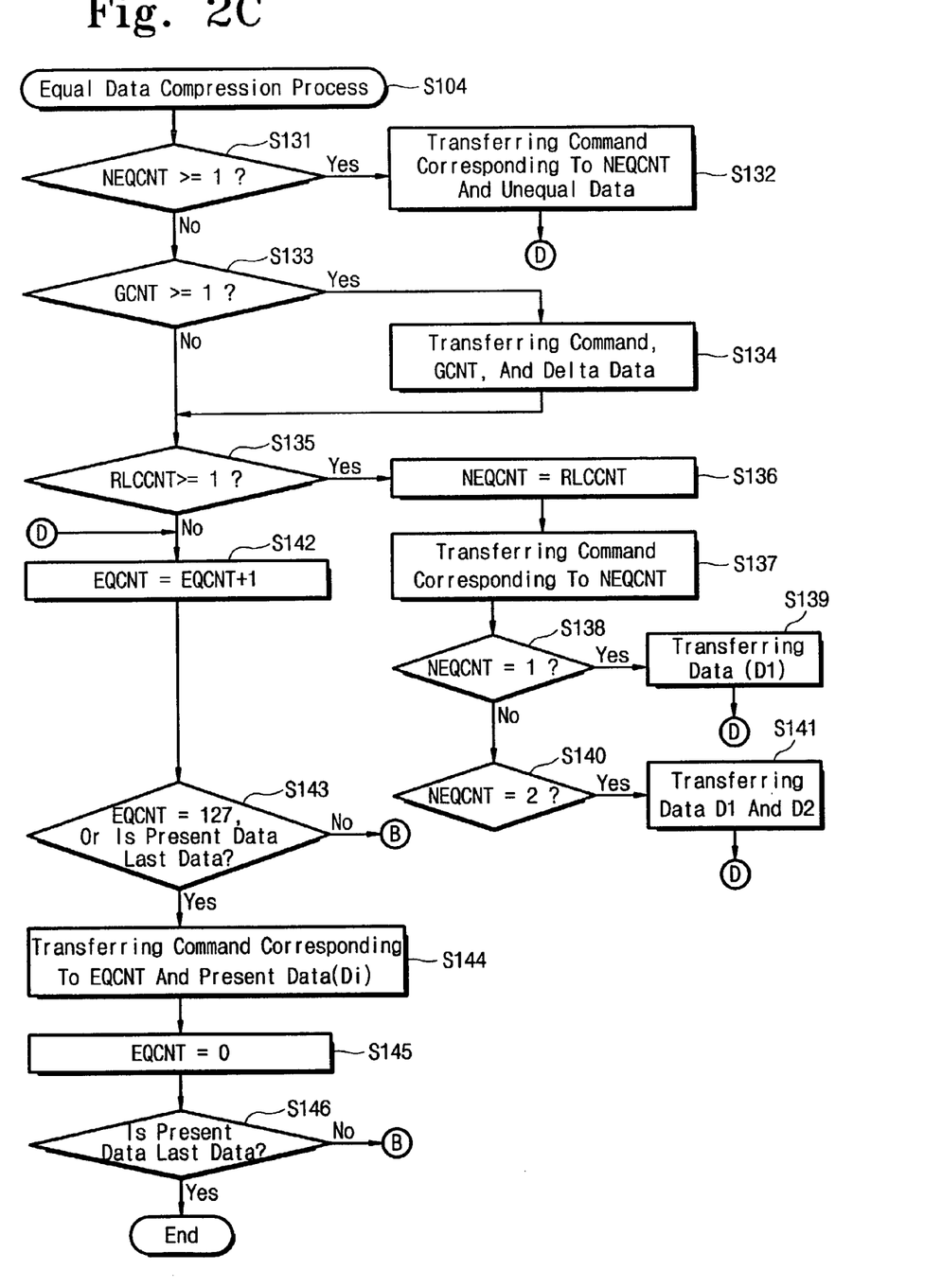

Continuing the process description, in step S103 as shown in FIG. 2A, when it is determined that the prior data Di-1 and the present data Di are equal, the equal data compression process (S104) is performed as follows. FIG. 2C is a flow chart showing the equal data compression process being performed when two adjacent data Di-1 and Di are equal.

In step S131, the data compressor 10 determines whether the value of the NEQCNT counter 17 equals 1 or more, the control proceeds with step S132. In step S132, the data compressor 10 outputs the command corresponding to the value of the NEQCNT counter 17, and outputs the unequal data of the number corresponding to the value of the NEQCNT counter 17 stored in the buffer 30. The operation of step S132 will be described in detail below.

In step S133, the data compressor 10 determines whether the value of the GCNT counter 19 equals 1 or more. If the value of the GCNT counter 19 equals 1 or more, the control proceeds with step S134. If the value of the GCNT counter 19 is less than 1, the control proceeds with step S135.

As explained above, the GCNT counter 19 performs the count-up operation by 1 when a series of four data are compressed by the delta-RLC compression processor of the present invention. For instance, when the data 0×00, 0×01, 0×02, 0×03, 0×03, . . . are sequentially input to the data compressor 10, the four data 0×00, 0×01, 0×02 and 0×03 are compressed by the delta-RLC compression process S106. The compressed result 0×00:0×00 is stored in the buffer 30 and, at this time, the value of the GCNT counter 19 becomes 1. Continuing this example, when the prior data Di-1 is 0×03 and the present data Di is 0×03, the equal data compression process S104 is performed. In this case, since the value of the GCNT counter 19 becomes 1 in step S133, the control proceeds with step S134. In step S134, the data compressor 10 transfers the delta-RLC compression command 7f, the value (or 1) of GCNT counter 19, and the delta data (0×00:0×00) into the data processing system 1. Then, the control proceeds with step S135.

In step S135, the data compressor 10 determines whether the value of the RLCCNT counter 18 equals 1 or more. If the value of the RLCCNT counter 18 equals 1 or more, the control proceeds with step S136. If the value of the RLCCNT counter 18 is less than 1, the control proceeds with step S140.

As explained above, the RLCCNT counter 18 performs the count-up operation when the difference between the prior data Di-1 and the present data Di is less than the reference value such that the delta-RLC compression process S104 is performed. Therefore, in case that the value of the RLCCNT counter 18 equals 1 or more, it can be known that the prior data Di-1 is being compressed according to the delta-RLC compression process S104. For example, when a series of four data 0×00, 0×02, 0×02, and 0×02 are sequentially input, the first and second data 0×00 and 0×02 are not equal, and a difference 0b10 between the second and first data 0×02 and 0×00 is less than the reference value 0b100. Thus, the delta-RLC compression process is performed such that the value of the RLCCNT counter 18 becomes "1". By contrast, since the third and second data 0×02 and 0×02 are equal, the equal data compression process S104 as shown in FIG. 2C is performed. At this time, since the value of the RLCCNT counter 18 becomes "1", the control proceeds with step S136.

In step S136, the data compressor 10 replaces the value of the RLCCNT counter 18 with the NEQCNT counter 17. In step S137, the data compressor 10 transfers the command corresponding to the value of the NEQCNT counter 17. In the foregoing example, since the value of the RLCCNT counter 18 is 1, the command becomes 00.

In step S138, the data compressor 10 determines whether the value of the NEQCNT counter 17 equals 1. As a result, if the value of the NEQCNT counter 17 is 1, the control proceeds with step S139, then transferring the data D1 stored in the register 11 to the data processing system 1. If the value of the NEQCNT counter 17 is not 1, the control proceeds with step S140. In the foregoing example, since the value of the NEQCNT counter 17 is 1, the data 0×00 stored in the register 11 is transferred to the data processing system 1.

In step S140, the data compressor 10 determines whether the value of the NEQCNT counter 17 is 2. As a result, if the value of the NEQCNT counter is 2, the control proceeds with step S141, thus transferring the data D1 and D2 stored in the registers 11 and 12 to the data processing system 1. If the value of the NEQCNT counter is not 2, the control proceeds with step S142.

In step S142, the data compressor 10 increases the value of the EQCNT counter by 1.

In step S143, if the value of the EQCNT counter 16 is 127 or the present data Di transferred from the data processing system 1 is the last data, the data compressor 10 proceeds with step S144. If the value of the EQCNT counter 16 is not 127 and the present data Di is not the last data, the data compressor 10 proceeds with step S101.

In step S144, the data compressor 10 outputs the command corresponding to the value of the EQCNT counter 16 and the present data Di as the equal data. In step S145, the data compressor 10 clears the value of the EQCNT counter 16.

In step S146, the data compressor 10 determines whether the present data Di is the last data. As a result, if the present data Di is the last data, the control is completed. If the present data Di is not the last data, the control proceeds with step S101 as shown in FIG. 2A.

For the data string 3, for example, in the case where the equal data 0×0a are repeatedly inputted into the data compressor 10 256 times, the data compressor 10 outputs (0×7e:0×0a) when the value of the EQCNT counter 16 is 127. When the value of the EQCNT counter 16 is 127 again, the data compressor 10 outputs (0×7e:0×0a), and outputs compressed data (0×01:0×0a) of the remaining two data elements.

0×0a, 0×0a, 0×0a, 0×0a, 0×0a, . . . , 0×0a, 0×0a, 0×0a, 0×0a=(0×7e:0×00), (0×7e:0×00), (0×01, 0×0a)

Figure 2D:
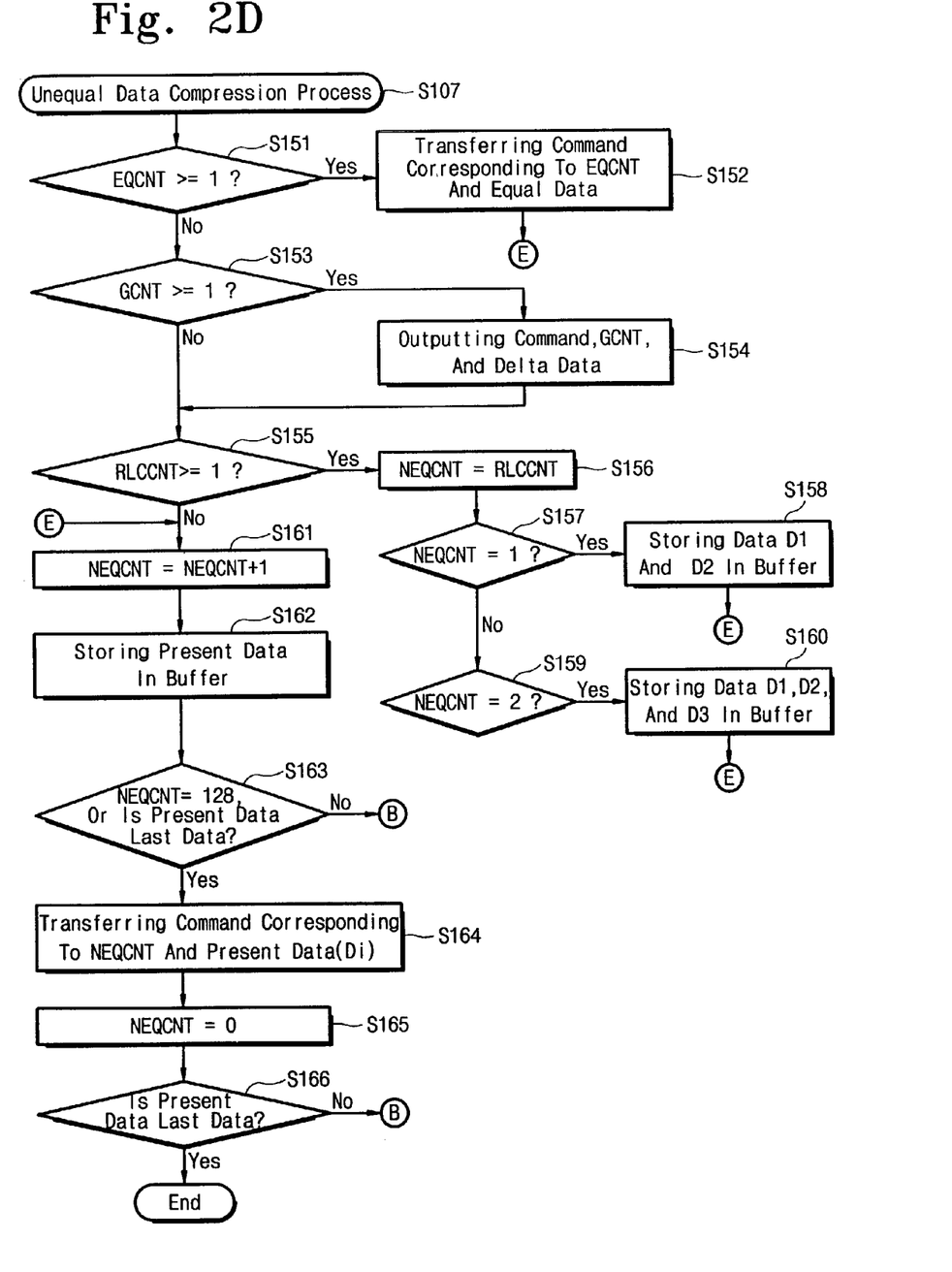

Continuing the description of the present invention, in step S105 as shown in FIG. 2A, when the difference between the prior and present data Di-1 and Di is more than the reference value REF1 or REF2, the unequal data compression process is performed as follows. FIG. 2D is a flow chart showing the unequal data compression process being performed when the difference between the two adjacent data Di-1 and Di is more than the reference value REF.

In step S151, the data compressor 10 determines whether the value of the EQCNT counter 16 equals 1 or more. If the value of the EQCNT counter 16 equals 1 or more, the control proceeds with step S152. In step S152, the data compressor 10 outputs the command corresponding to the value of the EQCNT counter 16, and outputs the prior data Di-1 as the equal data.

In step S153, the data compressor 10 determines whether the value of the GCNT counter 10 equals 1 or more. If the value of the GCNT counter 19 equals 1 or more, the control proceeds with step S154. If the value of the GCNT counter 19 is less than 1, the control proceeds with step S155.

As explained above, the GCNT counter 19 performs the count-up operation when a series of four data are compressed by the delta-RLC compression processor of the present invention. For example, the data 0×00, 0×01, 0×02, 0×03, 0×5d, . . . are sequentially input into the data compressor, the four data 0×00, 0×01, 0×02, and 0×03 are compressed by the delta-RLC compression processor S106, and the compressed result (0×00:0×00) is stored in the buffer 30. At this time, the value of the GCNT counter 19 becomes 1. In the event that the prior data Di-1 is 0×03, when the present data Di is 0×5d, the unequal data compression process S107 is performed. In this case, since the value of the GCNT counter 19 is 1, control proceeds with step S154. In step S154, the data compressor 10 transfers the delta-RLC compression command 7f, the value (or 1) of the GCNT counter 19, and the delta data (0×00:0×00) to the data processing system 1, and the control proceeds with step S155.

In step S155, the data compressor 10 determines whether the value of the RLCCNT counter 18 equals 1 or more. If the value of the RLCCNT counter 18 equals 1 or more, the control proceeds with step S156. If the value of the RLCCNT counter 18 is less than 1, the control proceeds with step S161.

As explained above, the RLCCNT counter 18 performs the count-up operation when the difference between the prior and present data Di-1 and Di is less than the reference value such that the delta-RLC compression process S104 is performed. Therefore, in case that the value of the RLCCNT counter 18 equals 1 or more, it can be known that the prior data Di-1 is compressed by the delta-RLC compression process S104. For example, when a series of four data 0x00, 0x02, 0x3c, and 0x69 are sequentially inputted, the first and second data 0x00 and 0x02 are not equal, and the difference 0b10 between the second and first data 0x02 and 0x00 is less than the reference value 0b100. Thus, the delta-RLC compression process is performed such that the value of the RLCCNT counter 18 becomes "1". However, the difference 0b111010 between the third and second data 0x2f and 0x02 is more than the reference value 0b1000, the unequal data compression process S107 is performed as shown in FIG. 2D. As a result of the determination in step S155, since the value of the RLCCNT counter 18 is "1", control proceeds with step S156.

In step S156, the data compressor 10 replaces the value of the RLCCNT counter 18 with the NEQCNT counter 17. In step S157, the data compressor 10 determines whether the value of the NEQCNT counter 17 is 1. As a result, if the value of the NEQCNT counter 17 is 1, the control proceeds with step S158, thus storing the data D1 stored in the registers 11 and 12 in the buffer 30. In the foregoing example, since the value of the NEQCNT counter 17 is 1, the data 0x00 and 0x02 stored in the registers 11 and 12 are stored in the buffer 30. As a result of determination in step S157, if the value of the NEQCNT counter 17 is not 1, control proceeds with step S159.

In step S159, the data compressor 10 determines whether the value of the NEQCNT counter 17 is 2. As a result, if the value of the NEQCNT counter 17 is 2, the control proceeds with step S160, thus transferring the data D1, D2, and D3 stored in the registers 11, 12, and 13 to the data processing system 1. If the value of the NEQCNT counter 17 is not 2, the control proceeds with step S161.

In step S161, the data compressor 10 increases the value of the NEQCNT counter 17 by 1. In step S162, the data compressor 10 stores the present data Di in the buffer 30.

In step S163, if the value of the NEQCNT counter 17 is 128 or the present data Di transferred from the data processing system 1 is the last data, the data compressor 10 proceeds with step S164. By contrast, if the value of the NEQCNT counter 17 is not 128 and the present data transferred from the data processing system 1 is not the last data, the data compressor 10 proceeds with step S101.

In step S164, the data compressor 10 outputs the command corresponding to the value of the NEQCNT counter 17 and the present data Di as the equal data. In step S164, the data compressor 10 clears the value of the NEQCNT counter 17.

In step S166, the data compressor 10 determines whether the present data Di is the last data. As a result, if the present data is the last data, the control is completed. If the present data is not the last data, the control proceeds with step S101 as shown in FIG. 2A.

According to the method as described above, for example, in the event that the difference between two adjacent data among the 256 data elements of data string 4 is more than the reference value, the following compressed data RLC_DATA are transferred to the data processing system 1.

0x05, 0x11, 0x3f, 0x2e, 0x91, . . . , 0x0a, 0xab, 0x7f, 0x19=(0x80:0x05, 0x11, 0x3f, . . . ), (0x80: . . . , 0xab, 0x7f, 0x19)

The equal and unequal data compression processes S104 and S107 described above perform the same operations as the conventional modified-RLC compression process. However, according to the above example, the conventional modified-RLC compression process allows equal data of 128 or less to be converted into a single compressed data, whereas the present invention enables equal data of 127 or less to be converted into a single compressed data for providing the delta-RLC compression command.

The data decompression operation of the data compression/decompression system 2 of the present invention will now be described with reference to the accompanying drawings, FIGS. 1 and 3A through 3D.

FIGS. 3A through 3D are flow charts illustrating the data decompression operation of the data compression/decompression system 2 as shown in FIG. 1.

Figure 3A:
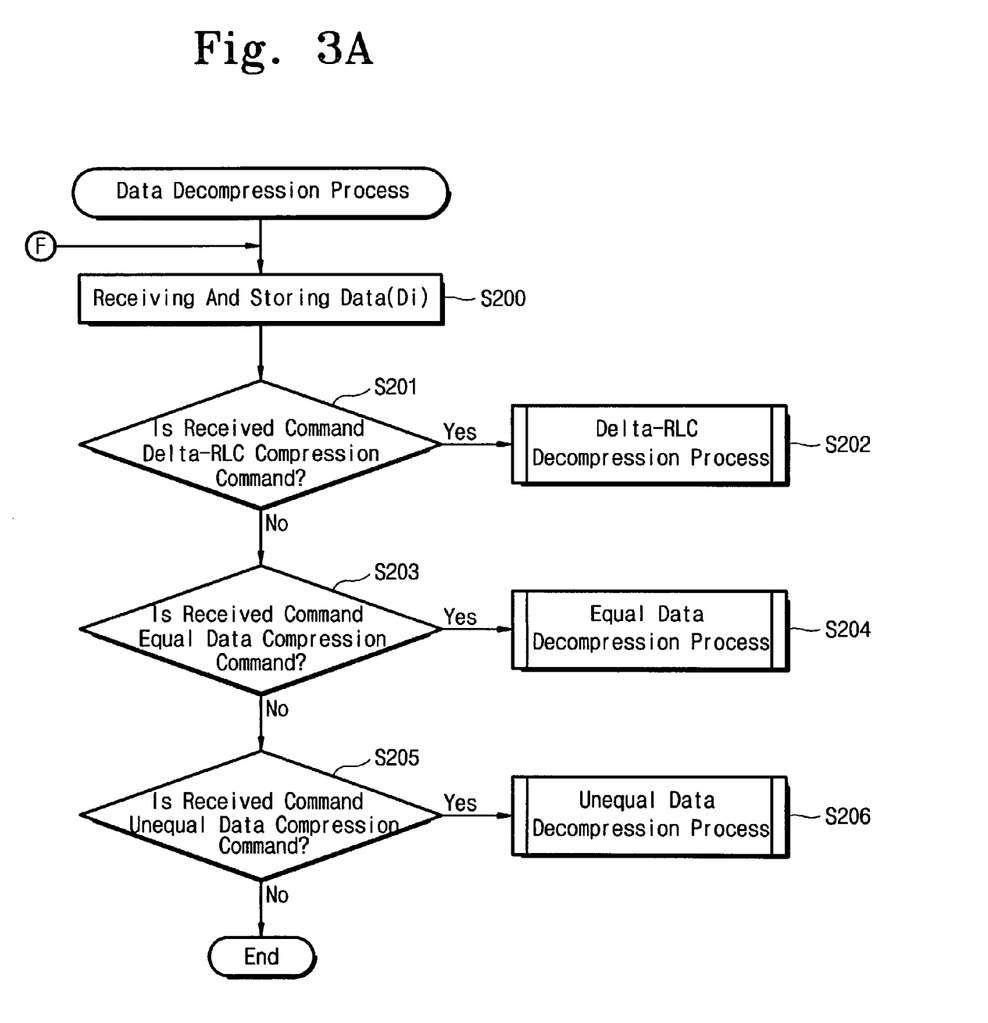
FIGS. 3A through 3D are flow charts illustrating data decompression operations of the data compression/decompression system 2 as shown in FIG. 1, in accordance with the present invention.

Referring now to FIG. 3A, in step S200, the data decompressor 40 receives a command CMD from the data processing system 1. The data decompressor 40 determines whether the command CMD received from the data processing system 1 is the delta-RLC compression command 0x7f. As a result, if the command CMD received from the data processing system 1 is the delta-RLC compression command 0x7f, the control proceeds with step S202, thus performing the delta-RLC decompression If the command CMD received from the data processing system 1 is not the delta-RLC compression command (or 0x7f), the control proceeds with step S203.

In step S203, the data decompressor 40 determines whether the command CMD received from the data processing system 1 is the equal data compression command (or 0x01, 0x02, 0x03, . . . , 0x7d or 0x7e). As a result, if the command CMD received from the data processing system 1 is the equal data compression command, the control proceeds with step S204, thus performing the equal data decompression. If the command CMD received from the data processing system 1 is not the equal data compression command, the control proceeds with step S205.

In step S205, the data decompressor 40 determines whether the command CMD received from the data processing system 1 is the unequal data compression command (or x00, 0x80, 0x81, . . . , 0xfe or 0xff). As a result, if the command CMD received from the data processing system 1 is the unequal data compression command, the control proceeds with step S206, thus performing the unequal data decompression. If the command CMD received from the data processing system 1 is not the unequal data compression system, the control operation is complete.

Figure 3B:
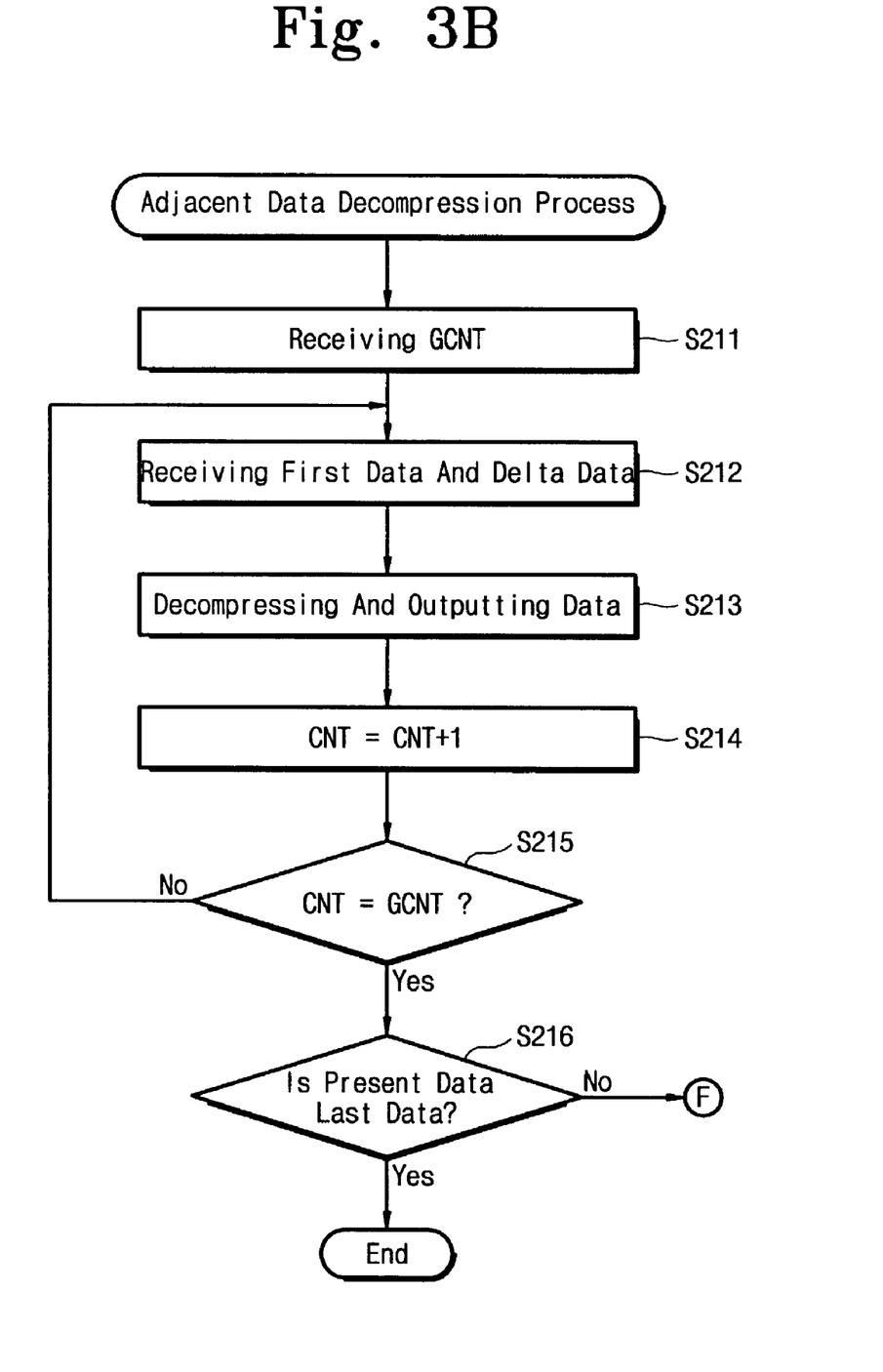

FIG. 3B is a flow chart showing detailed steps of the delta-RLC decompression process as shown in FIG. 3A.

In step S211, the data decompressor 40 receives the value GCNT from the data processing system 1 through the data line RLC_DATA. In step S212, the data decompressor 40 receives the first data and the delta data from the data processing system 1 through the data line RLC_DATA. In step S213, the data decompressor 40 decompresses four original data on the basis of the received first and delta data, thus transferring the decompressed data Di (i=1, 2, 3, and 4) into the data processing system 1. In step S215, the data decompressor 40 increases the value of the embedded counter 41 by 1.

In step S216, the data decompressor 40 determines whether the GCNT value received from the data processing system 1 and the count value of the counter 41 are equal. As a result, if the GCNT value received from the data processing system 1 and the count value of the counter 41 are equal, the control proceeds with step S215. Otherwise, the control proceeds with step S212, thus performing the foregoing operations repeatedly.

For instance, when the delta-RLC compressed data (0x7f: 0x40:0x00, 0x00, 0x00, 0x00, . . . , 0x00, 0x00) of the data string 1 that are output from the data processing system 1 are input into the data decompressor 40, the data decompressor 40 performs the foregoing operations repeatedly until the value of the counter 41 becomes 0x40. The data decompression operation of step S213 can be easily inferred from the foregoing data compression operation.

For example, in case that the compression start data is 0x00 and the delta data is 0x00, the delta values Delta(D1, D2)=0b00, Delta(D2, D3)=0b000 and Delta(D3, D4)=0b000 are derived from the delta data. Then, the original data are decompressed from the compression start data and the delta values. Since the compression start data is 0x00, the four original data Di (i=1, 2, 3, and 4) are 0x00, 0x01, 0x02, and 0x03 respectively. The decompressed data Di (i=1, 2, 3, and 4) are transferred to the data processing system 1.

In step S216, the data decompressor 40 determines whether the data received from the data processing system 1 is the last data. As a result, if the data received from the data processing system 1 is not the last data, the control returns to step S200 as shown in FIG. 3A. If the data received from the data processing system 1 is the last data, the control operation is complete.

Figure 3C:
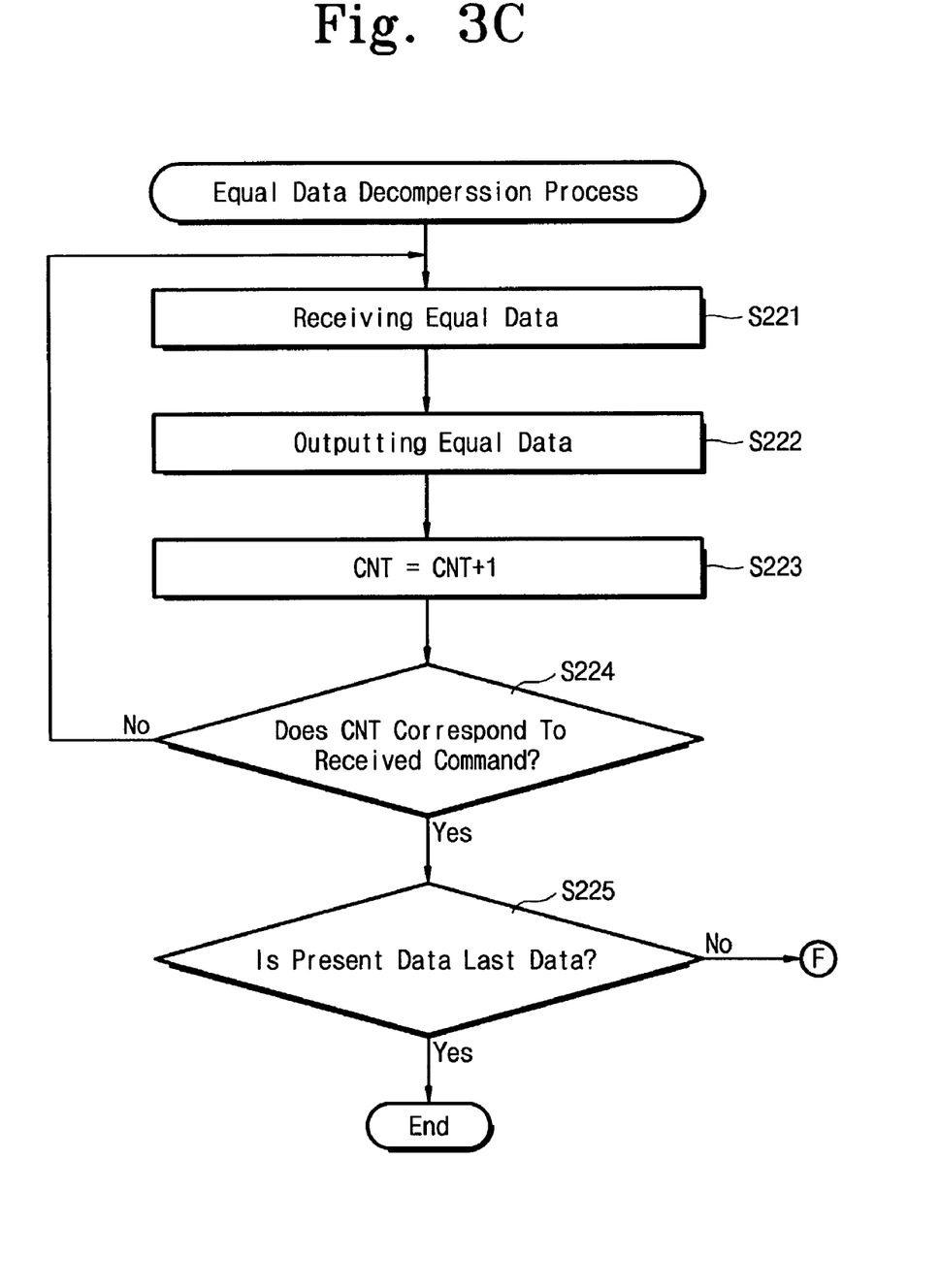

FIG. 3C is a flow chart showing detailed steps of the equal data decompression process as shown in FIG. 3A.

In step S221, the data decompressor 40 receives the equal data from the data processing system 1. In step S222, the data decompressor 40 transfers the equal data received from the data processing system 1 to the data processing system 1 as decompressed data Di. In step S223, the data decompressor 40 increases the value of the embedded counter 41 by 1. In step S224, the data decompressor 40 determines whether the value of the counter 41 equals the number of the equal data that the received command indicates. As a result, the value of the counter 41 equals the number of the equal data that the received command indicates, the control proceeds with step S225. Otherwise, the control returns to step S222.

As explained above, since the equal data to the number of N are compressed in the form of (command corresponding to the equality of the data to the number of N: equal data), the equal data should be transferred to the data processing system 1 N times in order to decompress to the original data. For example, if data string 3 from above is compressed, the result is (0x7e:0x00), (0x7e:0x00), and (0x01,0x0a). Since the command 0x7e indicates that a series of 127 data are equal, the equal data 0x00 should be transferred to the data processing system 1 127 times. Therefore, steps S222 through S224 are performed repeatedly until the value of the counter 41 becomes 127.

Step 225 determines whether the present data is the last data. As a result, if the present data is not the last data, the control returns to step S200 as shown in FIG. 3A. If the present data is the last data, the control is completed.

Figure 3D:
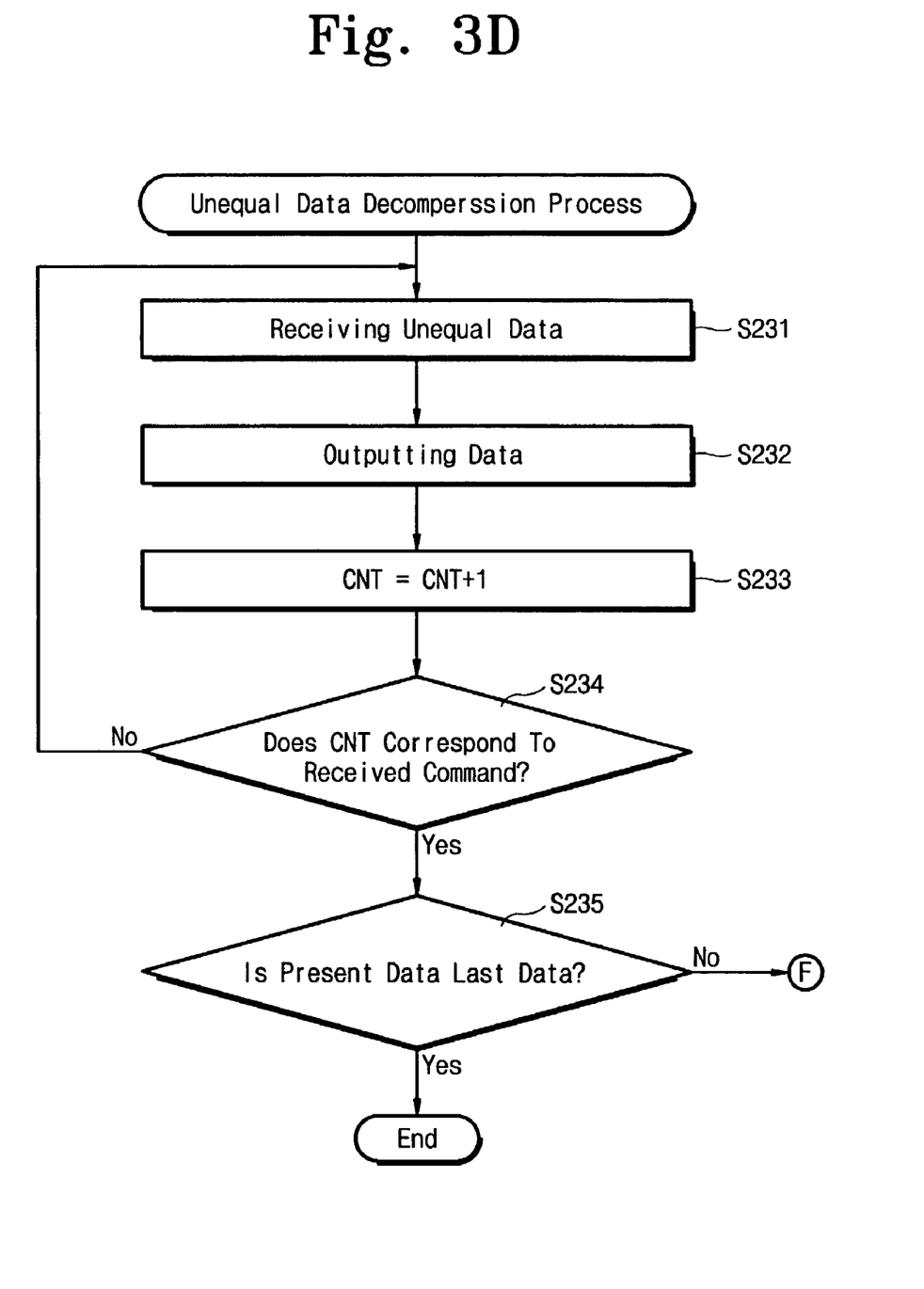

FIG. 3D is a flow chart showing detailed steps of the unequal data decompression process as shown in FIG. 3A.

In step S231, the data decompressor 40 receives the unequal data from the data processing system 1. In step S232, the data decompressor 40 outputs the unequal data received from the data processing system 1 as the decompressed data Di. In step S233, the data decompressor 40 increases the value of the counter 41 by 1. In step S234, the data decompressor 40 determines whether the value of the counter 41 equals the number of the unequal data that the received command indicates. As a result, if the value of the counter 41 equals the number of the unequal data that the received command indicates, the control proceeds with step S235. Otherwise, the control returns to step S231.

As explained above, a series of unequal data to the number of N are compressed in the form of (command corresponding to the non-equality of the data to the number of N: unequal data 1, unequal data 2, . . . , unequal data N). Accordingly, to decompress to the original data, the data received from the data processing system 1 should be provided to the data processing system 1 as the decompressed data Di. For instance, if the data string 4 is compressed, the result is (0x80:0x05, 0x11, 0x3f, . . . ), (0x80: . . . , 0xab, 0x7f, 0x19). Since the command 0x80 indicates that a series of 128 data are unequal, the data 0x05, 0x11, 0x3f, . . . that are inputted sequentially from the data processing system are outputted as the depressed data Di.

Consequently, according to the data compression/decompression system 2 of the present invention, in the case where a series of data are equal or differences between a series of data are great, it is data will not be compressed according to the delta-RLC compression process of the present invention. This results in the compression efficiency similar to that of the conventional modified-RLC compression process. However, in the case where differences between adjacent data are small, the delta-RLC compression process of the present invention can obtain higher compression efficiency as compared with the modified-RLC and the RLC compression processes.

For example, when four data D1, D2, D3, and D4 are 0x00, 0x01, 0x02, and 0x03, the data converted by the conventional RLC technique are (0x00:0x00), (0x00:0x01), (0x00:0x02), and (0x00:0x03), and the data converted by the conventional modified-RLC technique are (0xfe:0x00, 0x01, 0x02, 0x03). That is, the original data size is increased by the conventional RLC technique or modified-RLC technique. However, according to the delta-RLC technique of the present invention, the four data 0x00, 0x01, 0x02, and 0x03 are compressed to (0x00:0x03:0x00). In the delta-RLC technique of the present invention, the compression efficiency can be improved with an increase in the size of the data string, of which a difference between two adjacent data is small. For example, when the foregoing data string 1 of 256 bytes is compressed by the delta-RLC technique of the present invention, the compressed data becomes 1+1+(1+1)*64=130 bytes. That is, it can be known that the delta-RLC technique can obtain higher compression efficiency as compared with 258 bytes obtained by the modified-RLC technique.

Meanwhile, while the present embodiment has been shown in the drawings and described in connection with the method for compressing a series of four data to the form of (start data:delta data) by the delta-RLC technique, it is capable of various changes in the number of the compressed data. For example, in case that a series of five data D1, D2, D3, D4, and D5 are compressed by the delta-RLC technique, the delta values Delta(D1, D2), Delta(D2, D3), Delta(D3, D4), and Delta(D4, D5) are represented in 2 bits of a binary number. Therefore, in step S105 of FIG. 2A as described above, the reference value REF becomes 0b11. When the difference between the adjacent data is small, the compression efficiency can be improved by increasing the number of the data that are compressed to a single delta data.

As explained above, when the difference between the adjacent data is small, the delta-RLC technique can obtain higher compression efficiency as compared with the conventional RLC or modified-RLC compression techniques.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for compressing data comprising:
    receiving a first series of N data elements, where N is a positive integer;
    computing respective differences between two adjacent data elements among the data elements;
    determining whether the differences are all less than a reference value;
    when the differences are all less than the reference value:
        generating a delta data value on the basis of the differences and storing the generated delta data value;
        receiving a second series of N data following the first series; and
        returning to the step of computing the differences; and
    when the differences are all equal to the reference value or less and at least one delta data value is stored, generating a command indicating that compression operations are performed on the basis of the differences, the number of the stored delta data, and the stored delta data value as compressed data.

2. The method as claimed in claim 1, wherein generating the delta data value comprises:
    converting the respective differences between the two adjacent data elements into corresponding delta values; and
    concatenating the delta values in series for generating the delta data value.

3. A method for compressing data comprising:
    receiving present data;
    replacing the present data with prior data;
    receiving new present data following the prior data;
    computing a difference between the prior data and the present data and storing the difference;
    determining whether the difference between the prior data and the present data is between 0 and a reference value;
    when the difference between the prior data and the present data lies between 0 and the reference value:
        increasing a value of a first counter;
        returning to the replacing step when the value of the first counter is less than K, where K is a positive integer; and
        generating a delta data value on the basis of the difference when the value of the first counter is K; and
    when the difference between the prior data and the present data are all equal to the reference value or less, and at least one delta data value is generated, generating a command that indicates that compression operations have been performed on the basis of the difference, the number of stored delta data values, and the delta data value, as compressed data.

4. The method as claimed in claim 3, wherein generating the delta data value comprises:
    converting the respective differences into corresponding delta value; and
    concatenating the delta values in series for generating the delta data value.

5. The method as claimed in claim 3, wherein when the difference between the prior data and the present data is 0, the method further comprising performing the compression operation according to a modified-RLC (run length coding) method.

6. The method as claimed in claim 5, wherein when the value of the first counter is less than K (K is a positive integer), the method further comprising storing the first data in a storage means before returning to the replacing step.

7. The method as claimed in claim 6, wherein the modified-RLC compression method comprises:
    determining whether the value of the first counter is more than 1;
    when the value of the first counter is more than 1, the method comprising:
        generating an unequal command corresponding to the number of the data stored in the storing means;
        generating all the data stored in the storing means; and
        increasing the value of an equal counter; and
    generating an equal command corresponding to the value of the equal counter, and the present data when the value of the equal data is a maximum value or the present data is the last data; and
    returning to the replacing step when the value of the equal counter is not equal to the maximum value, or the present data is not the last data.

8. The method as claimed in claim 3, when the difference between the prior data and the present data is more than the reference value, the method further comprising performing the compression operation by the modified-RLC (run length coding) method.

9. The method as claimed in claim 8, when the value of the first counter is less than K (K is a positive integer), the method further comprising storing the prior data in the storing means before returning to the replacing step.

10. The method as claimed in claim 8, wherein the modified-RLC compression method comprises:
    determining whether the value of the first counter is more than 1;
    setting the value of an unequal counter to the number of the prior data stored in the storing means when the value of the first counter is more than 1;
    increasing the value of the unequal counter;
    storing the present data value in the storing means;
    generating an equal command corresponding to the value of the unequal counter and the present data when the value of the unequal counter is the maximum value or the present data is the last data; and
    returning to the replacing step when the value of the unequal counter is not the maximum value or the present data is not the last data.

11. A method for decompressing data that are compressed on the basis on differences between two adjacent data when two adjacent data among a series of N data elements, where N is a positive integer) are unequal, and the respective differences between the two adjacent data are less than a reference value, the method comprising:
    receiving a command;
    determining whether the command indicates data compression based on the differences;
    when the command indicates data compression based on the differences, the method comprising:
        receiving the number of the compressed data, a first data, and a second data;

decompressing N elements of original data from the first and second data;

increasing a value of a counter;

determining whether the number of the compressed data equals the value of the counter; and returning to the step of receiving the first and second data when the number of the compressed data does not equal the value of the counter.

12. The method as claimed in claim 11, wherein decompressing N elements of original data comprises:

partitioning the second data for generating delta values to the number of N-1 corresponding respectively to two adjacent data among the N data elements;

converting the delta values of the two adjacent data into the corresponding difference values; and decompressing N original data elements from the first data and the differences between the two adjacent data.

* * * * *